(12) United States Patent
Lim

(10) Patent No.: US 7,471,113 B1
(45) Date of Patent: Dec. 30, 2008

(54) LOW CROWBAR CURRENT SLEW RATE CONTROLLED DRIVER

(75) Inventor: Edison Kah Hooi Lim, Pulau Pinang (MY)

(73) Assignee: Marvell International Ltd., Hamilton (BM)

( * ) Notice: Subject to any disclaimer, the term of this patent is extended or adjusted under 35 U.S.C. 154(b) by 0 days.

(21) Appl. No.: 11/859,434

(22) Filed: Sep. 21, 2007

Related U.S. Application Data

(60) Provisional application No. 60/826,988, filed on Sep. 26, 2006.

(51) Int. Cl.
*H03K 19/0175* (2006.01)
(52) U.S. Cl. .......................................... 326/87; 326/83
(58) Field of Classification Search .................... 326/26, 326/27, 82–87
See application file for complete search history.

(56) References Cited

U.S. PATENT DOCUMENTS 5,568,062 A * 10/1996 Kaplinsky .................... 326/27
5,877,647 A * 3/1999 Vajapey et al. ............... 327/391
5,977,790 A * 11/1999 Sanwo et al. ................... 326/27
6,894,547 B2 * 5/2005 Takahashi .................... 327/170

* cited by examiner

*Primary Examiner*—Don P Le

(57) ABSTRACT

A slew rate controlled circuit driver generates a binary output signal with strong direct current (DC) characteristics based on a received binary logic signal, while minimizing crowbar current. The slew rate controlled circuit driver may include a first driver with smaller transistors that open and/or close quickly to allow a generated output signal to meet required rise and fall time requirements, and may include a second driver with larger transistors that open and/or close more slowly, that allow the generated output signal to support for strong DC signal characteristics, such as support for high DC current loads without degrading the DC voltage signal levels. Further, OPEN and CLOSE states of transistors within each of the first and second drivers may be controlled to reduce, during switching between HIGH and LOW output signal states, the establishment of paths between HIGH signal sources and LOW signal sources that contribute to crowbar current.

36 Claims, 9 Drawing Sheets

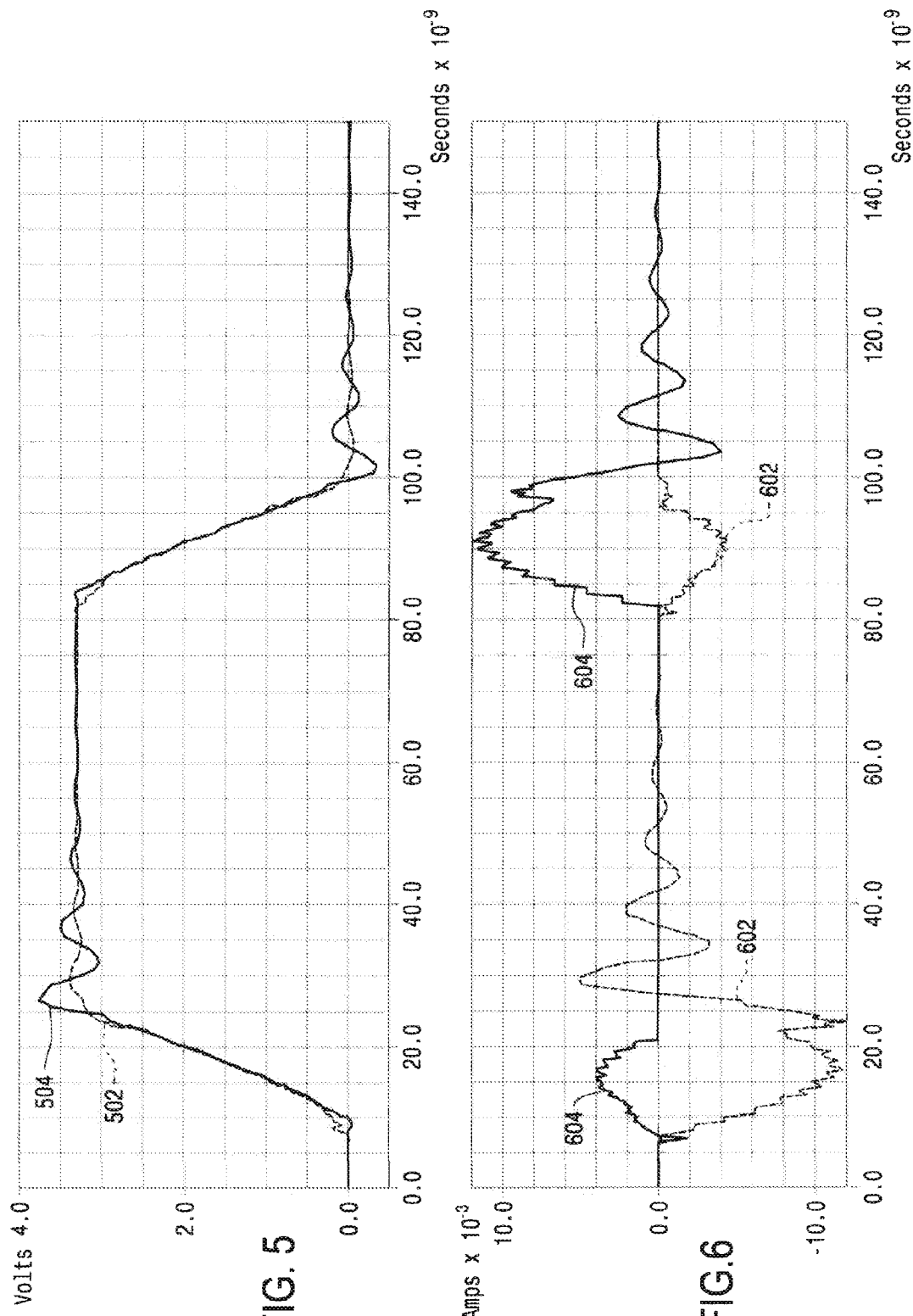

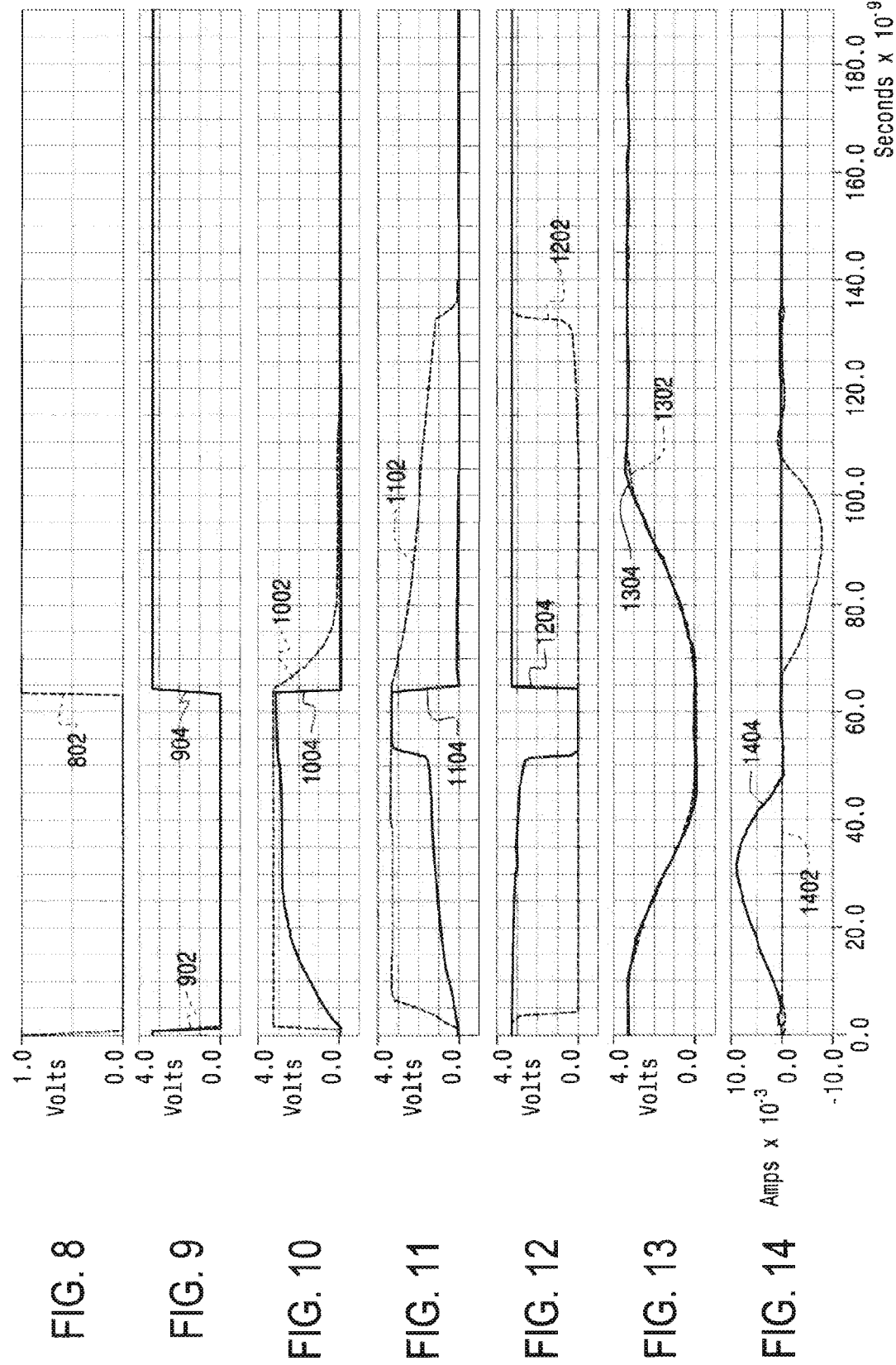

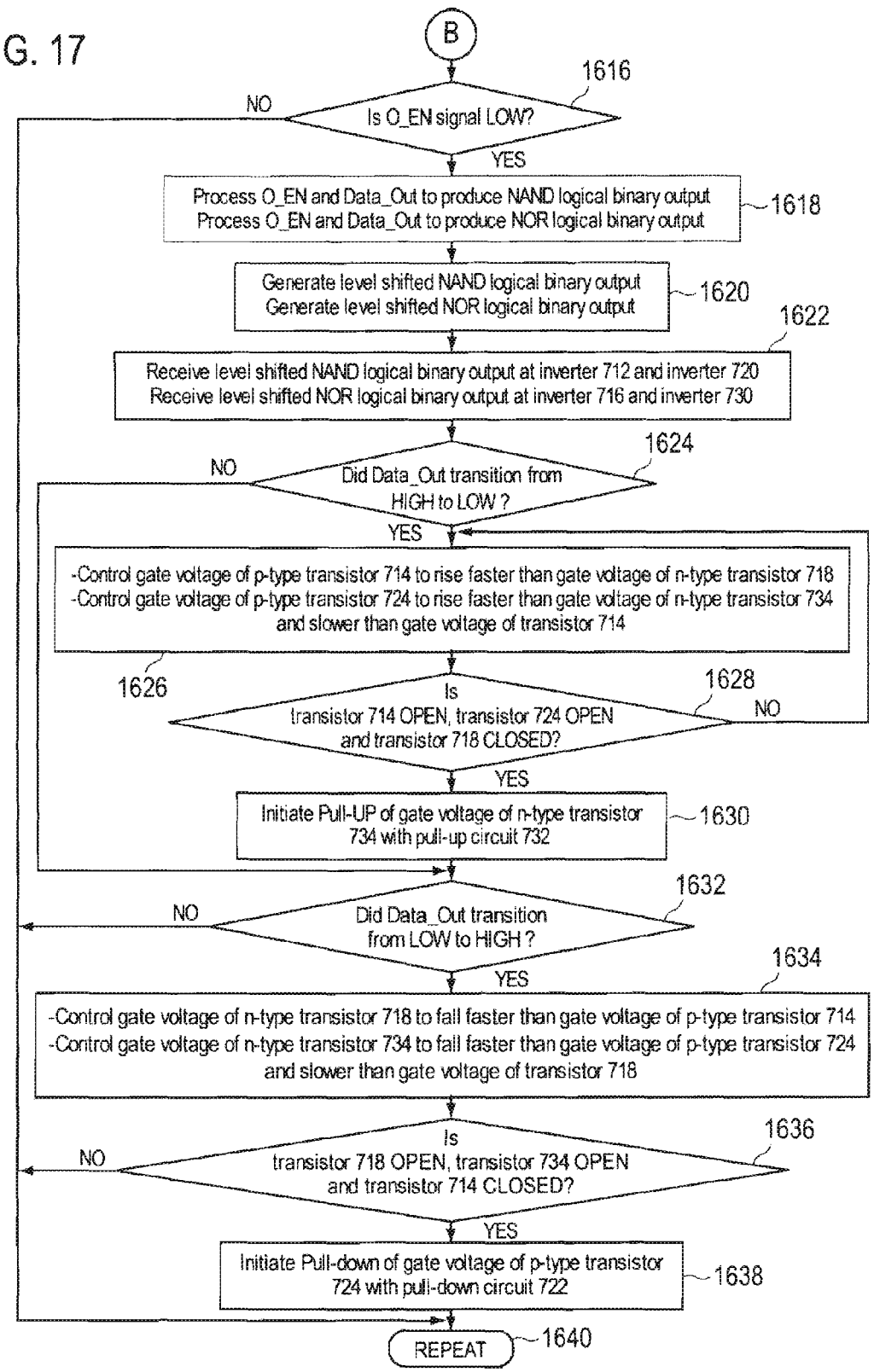

US 7,471,113 B1

LOW CROWBAR CURRENT SLEW RATE CONTROLLED DRIVER

INCORPORATION BY REFERENCE

This application claims the benefit of U.S. Provisional Application No. 60/826,988, "Extremely Low Crowbar Current During Switching for 90 nm Slew Rate Controlled Driver" filed by Edison Hooi Lim on Sep. 26, 2006, which is incorporated in its entirety by reference herein.

BACKGROUND

FIG. 1 is a schematic diagram of an exemplary circuit 100 that may be used to drive an external circuit load based on a data signal output by a logic circuit. For example, as shown in FIG. 1, a driver circuit 102 may receive a logic circuit output signal DATA_OUT at node 113, a HIGH source signal voltage VDD, e.g., 3.3 volts, and a LOW source signal VSS, e.g., 0.0 volts, and may generate a node 129 a driver circuit output signal SIG_OUT. Node 129 may be connected via a transmission line 168 to a node 131 within another circuit. In this manner, driver circuit output signal SIG_OUT may be received at node 131 as signal FAR_SIG_OUT and may drive a load 170, e.g., 5 pF, placed between node 131 and ground GND.

FIG. 2 is a more detailed schematic diagram of exemplary circuit 100 described above with respect to FIG. 1. As shown in FIG. 2, driver circuit 102 may include a level shifter 144, first inverter 112, p-type transistor 114, second inverter 116, and n-type transistor 118. One of a source and drain of p-type transistor 114 may connect to HIGH source signal voltage VDD and the other of the source and drain of p-type transistor 114 may connect to driver circuit node 129. One of a source and drain of n-type transistor 118 may connect to driver circuit node 129 and the other of the source and drain of n-type transistor 118 may connect to a LOW source signal voltage VSS. An input lead of level shifter 144 may connect to node 113 and an output lead of level shifter 144 may connect to an input lead of first inverter 112 and an input lead of second inverter 116. An output lead of first inverter 112 may connect to the gate of p-type transistor 114, and an output lead of second inverter 116 may connect to the gate of n-type transistor 118.

As further shown in FIG. 2, driver circuit 102 may be implemented on a periphery of a first integrated circuit 101. For example, driver circuit 102 may connect via the input lead of level shifter 144 at node 113 to a logic circuit (not shown) implemented on first integrated circuit 101. Further, driver circuit 102 output node 129 may connect to a pad 167 on first integrated circuit 101.

In operation, driver circuit 102 may receive logic circuit output signal DATA_OUT, a node 113, from the logic circuit within first integrated circuit 101, and may generate a driver circuit output signal SIG_OUT that may be delivered to pad 167 of first integrated circuit 101. A transmission line 168 may transmit driver circuit output signal SIG_OUT to an input pad 169 at node 131 of a second integrated circuit 103 to drive a load. For example, as shown in FIG. 2, signal SIG_OUT may be used to drive a 5 pF load 170 within second integrated circuit 103. Such a load may be due to a receiver circuit on second integrated circuit 103 that may be configured to receive and use signal SIG_OUT in subsequent operations. In this manner, driver circuit 102 may facilitate communication between various integrated circuits in an electronic system.

Although the circuit described above with respect to FIG. 2 may be used to implement an integrated driver circuit that facilitates communication between integrated circuits, such driver circuits suffer from inefficiencies such as the inability to drive heavy loads and crowbar currents. A crowbar current is a sudden surge of current flowing from a high voltage source to ground as a result of the rapid ON and OFF switching of transistors along a circuit path between the high voltage source and ground. For example, in the circuit presented in FIG. 2, internal transistor delays may result in a condition in which p-type transistor 114 remains ON temporarily as it is being turned OFF while n-type transistor 118 is being turned ON. This may result in a sudden surge of current flowing from high signal source VDD to low signal source VSS creating what is commonly known as crowbar current.

For example, assuming that logic circuit output signal DATA_OUT is initially LOW, the inverted signal at node 115 is HIGH, the inverted signal at node 123 is HIGH, p-type transistor 114 is OPEN, i.e., in a non-conducting state, and n-type transistor 118 is CLOSED, i.e., in a conducting state. Therefore, driver circuit output signal SIG_OUT is LOW. However, as signal DATA_OUT begins to rise and the inverted signal at node 115 falls to a threshold voltage of p-type transistor 114, p-type transistor 114 may CLOSE, while n-type transistor 118 is still CLOSED. Therefore, a crowbar current passes from HIGH signal source VDD to LOW signal source VSS.

Further, assuming that logic circuit output signal DATA_OUT is HIGH, as signal DATA_OUT begins to lower and the inverted output signal of transistor 116 at node 123 rises above a threshold voltage of n-type transistor 118, n-type transistor 118 may CLOSE, while p-type transistor 114 is still CLOSED. Therefore, a crowbar current may again pass from HIGH signal source VDD to LOW signal source VSS.

Such crowbar currents result in a wasteful dissipation of power. In an integrated circuit with a large number of integrated circuits, the cumulative loss of power due to crowbar currents may be significant. Further, during the period when both n-type transistor 118 and p-type transistor 114 are both on there may be a contention over the voltage at node 129 and driver circuit output signal SIG_OUT. This contention may add to and amount of time required to switch the value of signal SIG_OUT, i.e., may add to the total delay through the driver circuit.

SUMMARY

FIG. 3 is a plot of output signals generated by an exemplary driver circuit, such as the driver circuit presented in FIG. 2, in response to a LOW-to-HIGH and HIGH-to-LOW logic circuit output signal, DATA_OUT, switching cycle. The output signals shown in FIG. 3 are representative of output that may be generated by the driver circuit of FIG. 2, if implemented using metal-oxide-semiconductor (MOS) 130 nm integrated circuit technology.

For example, output signal 302 is representative a signal that may be generated by the circuit presented in FIG. 2 at node 129, prior to transmission over transmission line 168. Output signal 304 is representative a signal that may be generated by the circuit presented in FIG. 2 at node 131, after the signal at node 129 has been transmitted over transmission line 168. As shown in FIG. 3, both the output signal 302 at node 129 and the transmitted output signal 304 at node 131 demonstrate varying levels of instability following at transition from LOW-to-HIGH or a transition from HIGH-to-LOW. For example, on a transition from LOW to HIGH, output signal 304 oscillates about the VDD voltage of 3.3 volts by as much as ±0.6 volts until finally leveling out after a period of over 40 ns. On a transition from HIGH to LOW, output signal 304 oscillates in a similar manner about the VSS voltage of 0.0 volts for a similar period of time. As shown in FIG. 3, following a transition from LOW-to-HIGH or a transition from HIGH-to-LOW output signal 302 also oscillates about the VDD and VSS voltage levels, respectively, but to a lesser degree than signal 304.

FIG. 4 is a plot of crowbar current that may be generated by the exemplary driver circuit addressed above with respect to FIG. 3 during the same LOW-to-HIGH and HIGH-to-LOW. As shown in FIG. 4 with respect to plot 404, a crowbar current of as high as +2.0 mA may be generated on a LOW-to-HIGH logic transition. Further, as shown in FIG. 4 with respect to plot 402, a crowbar current of as high as −2.0 mA may be generated on a HIGH-to-LOW logic transition.

FIG. 5 is a plot of output signals that may be generated by an exemplary driven circuit, such as the driver circuit presented in FIG. 2, implemented using metal-oxide-semiconductor (MOS) 90 nm integrated circuit technology, in response to a LOW-to-HIGH and HIGH-to-LOW logic circuit output signal, DATA_OUT, switching cycle.

For example, output signal 502 is representative a signal that may be generated by the circuit driver presented in FIG. 2 at node 129, prior to transmission over transmission line 168. Transmitted output signal 504 is representative a signal that may be generated by the circuit driver presented in FIG. 2 at node 131, after the signal at node 129 has been transmitted over transmission line 168. As shown in FIG. 5, both the output signal 502 at node 129 and the transmitted transmitted output signal 504 at node 131 demonstrate varying levels of instability following a transition from LOW-to-HIGH or from HIGH-to-LOW. For example, on a transition from LOW to HIGH, transmitted output signal 504 oscillates about the VDD voltage of 3.3 volts by as much as ±0.6 volts until finally leveling out after a period of over 40 ns. On a transition from HIGH to LOW, transmitted output signal 504 oscillates in a similar manner about the VSS voltage of 0.0 volts for a similar period of time. As shown in FIG. 3, following a transition from LOW-to-HIGH or from HIGH-to-LOW output signal 502 also oscillates about VDD and VSS voltages, but to a lesser degree than transmitted output signal 504.

FIG. 6 is a plot of crowbar current that may be generated by the exemplary driver circuit addressed above with respect to FIG. 5 during the same LOW-to-HIGH and HIGH-to-LOW switching cycle. As shown in FIG. 6 with respect to plot 604, a crowbar current of as high as +4.0 mA may be generated on a LOW-to-HIGH logic transition. Further, as shown in FIG. 6 with respect to plot 602, a crowbar current of as high as −4.0 mA may be generated on a HIGH-to-LOW logic transition. Both crowbar current responses continue to oscillate around 0.0 mA until finally dampening out over a period of over 40 ns. The crowbar current shown in FIG. 6 may further includes a high frequency component, possibly the result of the rapid switching of the driver.

BRIEF DESCRIPTION OF THE DRAWINGS

Exemplary embodiments of a slew rate controlled driver with low crowbar current during switching and strong DC driving characteristics will be described with reference to the following drawings, wherein like numerals designate like elements, and wherein:

FIG. 5 is a plot of exemplary driver circuit output signals representative of an exemplary driver circuit, such as the driver circuit presented in FIG. 2, implemented using metal-oxide-semiconductor (MOS) 90 nm integrated circuit technology, during a LOW-to-HIGH and HIGH-to-LOW switching cycle;

FIG. 6 is a plot of exemplary crowbar current generated by an exemplary driver circuit, such as the driver circuit presented in FIG. 2, implemented using metal-oxide-semiconductor (MOS) 90 nm integrated circuit technology, during a LOW-to-HIGH and HIGH-to-LOW switching cycle;

FIG. 8 is a plot of an exemplary HIGH-to-LOW and LOW-to-HIGH data logic circuit output that may be received as input by the exemplary slew rate controlled driver presented in FIG. 7, during a during a HIGH-to-LOW and LOW-to-HIGH switching cycle;

FIG. 9 is a plot of an exemplary pair of level-shifted data logic signals that may be internally generated by the exemplary slew rate controlled driver presented in FIG. 7, during an exemplary HIGH-to-LOW and LOW-to-HIGH switching cycle;

FIG. 10 is a plot of an exemplary pair of signals that may be generated by a first driver within the exemplary slew rate controlled driver presented in FIG. 7, during an exemplary HIGH-to-LOW and LOW-to-HIGH switching cycle;

FIG. 11 is a plot of an exemplary pair of signals that may be generated by a second driver within the exemplary slew rate controlled driver presented in FIG. 7, during an exemplary HIGH-to-LOW and LOW-to-HIGH switching cycle;

FIG. 12 is a plot of an exemplary pair of signals that may be generated by a delayed pull-up circuit and by a delayed pull-down circuit within the exemplary slew rate controlled driver presented in FIG. 7, during an exemplary HIGH-to-LOW and LOW-to-HIGH switching cycle;

FIG. 13 is a plot of exemplary driver circuit output signals representative of the output signals produced by the exemplary slew rate controlled driver presented in FIG. 7, in response to HIGH-to-LOW and LOW-to-HIGH data logic circuit data output such as that presented in FIG. 8;

FIG. 14 is a plot of exemplary crowbar current that may be generated by the exemplary slew rate controlled driver presented in FIG. 7, during an exemplary HIGH-to-LOW and LOW-to-HIGH switching cycle;

FIG. 16 and FIG. 17 are a flow diagram representing the processing performed by slew rate controlled circuit driver 700 to generate driver circuit output signal SIG_OUT in response to logic circuit output signal, DATA_OUT.

DETAILED DESCRIPTION OF EMBODIMENTS

Figure 7:
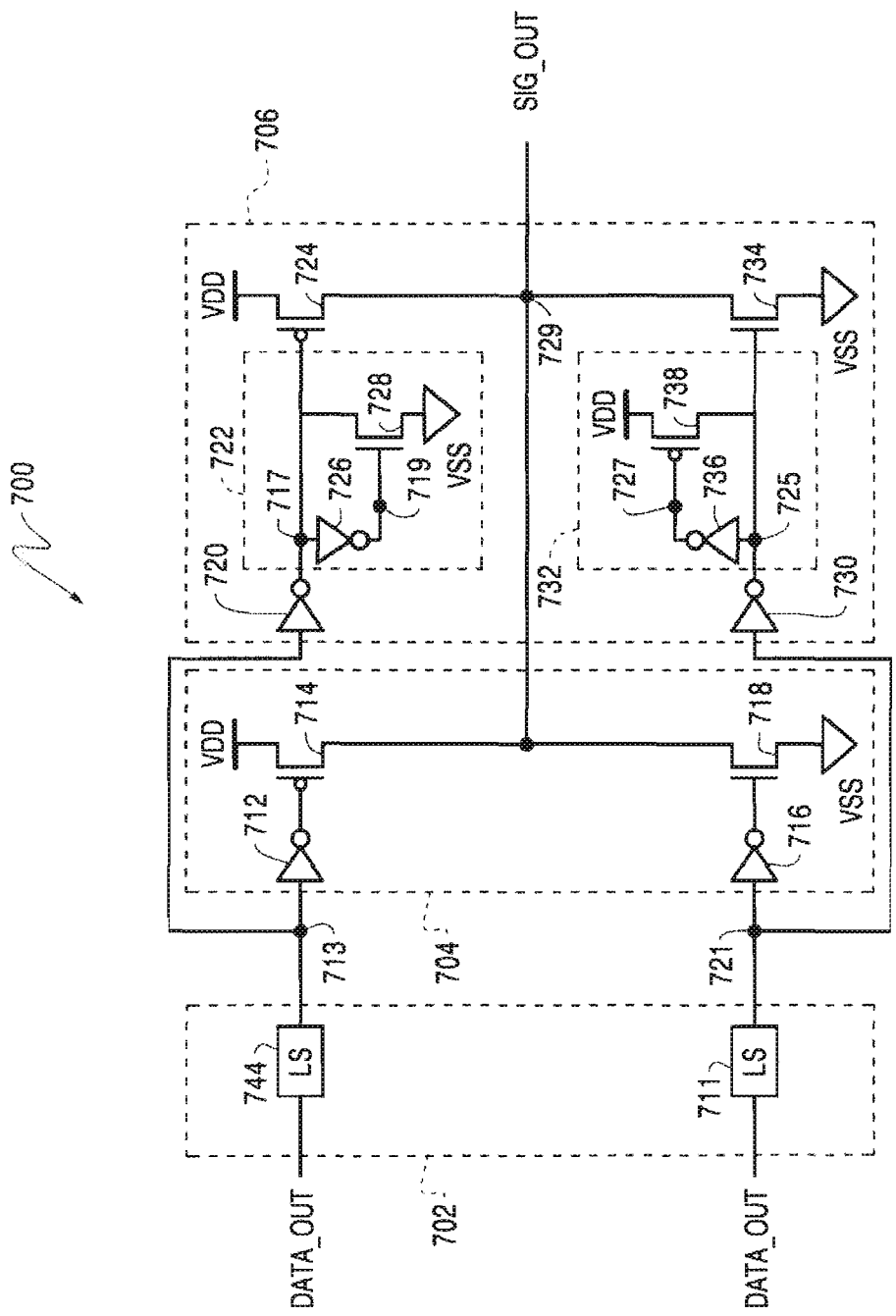
FIG. 7 is a circuit diagram of an exemplary embodiment of a slew rate controlled driver, with low crowbar current during switching and with strong DC driving characteristics.

FIG. 7 is a circuit diagram of an exemplary embodiment of a slew rate controlled circuit driver 700 that generates an output signal with strong direct current (DC) characteristics based on a received binary logic, i.e., HIGH and LOW data stream. Such an exemplary circuit drive may be included within an integrated circuit between a binary logic circuit and a transmission line pad. For example, in one exemplary embodiment, slew rate controlled circuit driver 700 may receive a binary logic circuit output signal and generate a corresponding binary output signal that switches between a DC level of 0.0 volts and a DC level of 3.3 volts and may be relied on to supply a current as high as 16 mA without degrading the DC voltage signal levels. Such a signal may be sufficiently strong to drive an external load associated with another circuit across a transmission line.

As shown in FIG. 7, the exemplary slew rate controlled circuit driver 700 may include a level shifter circuit 702, a first driver 704 and a second driver 706.

Level shifter circuit 702 may receive LOW and HIGH binary logic voltage levels and shift the respective LOW and HIGH binary logic voltages levels to match the corresponding LOW and HIGH voltage levels used by first driver 704 and a second driver 706. For example, in an integrated circuit that uses LOW and HIGH binary logic voltage levels of 0.0 volts and 1.0 volts, respectively, level shifter 702 may adjust the respective voltage levels to 0.0 volts and 3.3 volts, respectively. In one exemplary embodiment, a received binary logic signal may be received and compared to a threshold level maintained by a comparator. If the received logic value is less than the threshold, level shifter 702 may output a corresponding LOW value of 0.0 volts, however, if received logic value is greater than the threshold, level shifter 702 may output a corresponding HIGH value of +3.3 volts.

As shown in FIG. 7, an exemplary level shifter circuit 702 may include a plurality of individual level shifters. For example, the exemplary level shifter circuit 702 shown in FIG. 7 includes two individual level shifters, level shifter 744 and level shifter 711, each receiving a logic data output signal based on logic circuit output signal DATA_OUT. Use of a plurality of logic shifters to feed shifted logic signals into both first driver 704 and second driver 706, assures that no one level shifter in level shifter circuit 702 is overburdened, which would result in delayed transistor response times. Therefore, use of a plurality of level shifters and thereby avoiding an overloading of the control signals driving first driver 704 and second driver 706 allows greater control over the precise switching times of transistors within first driver 704 and second driver 706. Nevertheless, level shifter circuit 702 could be configured with a single level shifter that receives a single logic data output signal based on logic circuit output signal DATA_OUT and that provides a single level shifted output that may be supplied to both first driver 704 and second driver 706.

First driver 704 and a second driver 706 may work together, in parallel, to generate a driver circuit output signal SIG_OUT at a circuit driver output node 729 that meets required rise and fall time requirements and that also provides robust DC drive characteristics. For example, as described in greater detail below, first driver 704 may include small transistors that open and/or close quickly to allow driver circuit output signal SIG_OUT to meet required rise and fall time requirements, and second driver 706 may include larger transistors that open and/or close more slowly, but that are capable of allowing driver circuit output signal SIG_OUT to meet robust DC drive characteristic requirements. Further, first driver 704 and a second driver 706 may each be configured, individually and as a pair, to reduce crowbar current, as described in greater detail below.

As shown in FIG. 7, first driver 704 may include first inverter 712, p-type transistor 714, second inverter 716, and n-type transistor 718. One of a source and drain of p-type transistor 714 may connect to a HIGH source signal voltage VDD and the other of the source and drain of p-type transistor 714 may connect to driver circuit output node 729. One of a source and drain of n-type transistor 718 may connect to driver circuit output node 729 and the other of the source and drain of n-type transistor 718 may connect to a LOW signal source voltage VSS. An input lead of first inverter 712 may connect to an output lead of level shifter 744 and an output lead of first inverter 712 may connect to the gate of p-type transistor 714. An input lead of second inverter 716 may connect to an output lead of level shifter 711, and an output lead of second inverter 716 may connect to the gate of n-type transistor 718.

As addressed above, first driver 704 may include smaller transistors that open and/or close quickly to allow driver circuit output signal SIG_OUT to meet required rise and fall time requirements. Further, first driver 704 may be configured to reduce crowbar current. Reduction of crowbar current in first driver 704 may be achieved by minimizing the time that p-type transistor ;714 and n-type transistor 718 are both CLOSED when first driver 704 switches in response to a change in state, i.e., HIGH-to-LOW or LOW-to-HIGH of the logic circuit output signal. This may be achieved by strictly controlling the relative timing of the gate voltages used to open and close each of p-type transistor 714 and n-type transistor 718. In the exemplary circuit shown in FIG. 7, control of the gate voltage used to open and close p-type transistor 714 may be based on the characteristics of inverter 712; control of the gate voltage used to open and close n-type transistor 718 may be based on the characteristics of inverter 716. Precise timing of the respective gate voltages of p-type transistor 714 and n-type transistor 718 based on the output of inverter 712 and inverter 716, respectively, is addressed in greater detail with respect to FIGS. 9-10.

As shown in FIG. 7, second driver 706 may include first inverter 720, p-type transistor 724, second inverter 730, and n-type transistor 734. One of a source and drain of p-type transistor 724 may connect to a HIGH signal and source voltage VDD and the other of the source and drain of p-type transistor 724 may connect to driver circuit output node 729. One of a source and drain of n-type transistor 734 may connect to driver circuit output node 729 and the other of the source and drain of n-type transistor 734 may connect to a LOW signal source voltage VSS. An input lead of first inverter 720 may connect to an output of level shifter 744 and an output lead of the first inverter 720 may connect to the gate of n-type transistor 724. An input lead of second inverter 730 may connect to an output lead of level shifter 711, and an output lead of second inverter 730 may connect to the gate of n-type transistor 734.

In addition, as shown in FIG. 7, second driver 706 may include delayed pull-down circuit 722 and delayed pull-up circuit 732, as addressed in greater detail below with respect to FIGS. 11-12. Delayed pull-down circuit 722 may include a third inverter 726 and a second n-type transistor 728. One of a source and a drain of n-type transistor 728 may connect to an output lead of inverter 720 at node 717 and the other of the source and drain of n-type transistor 728 may connect to LOW signal source voltage VSS. An input lead of third inverter 726 may be attached to the output lead of first inverter 720 and an output lead of third inverter 726 may be connected to a gate of second n-type transistor 728. Delayed pull-up circuit 732 may include a fourth inverter 736 and a second p-type transistor 738. One of a source and a drain of p-type transistor 738 may connect to an output lead of second inverter 730 at node 725 and the other of the source and drain of n-type transistor 738 may connect to HIGH signal source voltage VDD. An input lead of fourth inverter 736 may be attached to the output lead of second inverter 730 and an output lead of fourth inverter 736 may be connected to a gate of second p-type transistor 738.

Control and operation of slew rate controlled circuit driver 700 may be described with respect to FIGS. 8-14.

FIG. 8 is a plot of an exemplary HIGH-to-LOW and LOW-to-HIGH logic circuit output signal, DATA_OUT, that may be received as input by the exemplary slew rate controlled driver presented in FIG. 7, during a during a HIGH-to-LOW and LOW-to-HIGH switching cycle. As shown in FIG. 8, the logic circuit output signal drops from a logical HIGH of 1.0 volts to a logical LOW of 0.0 volts at time≈0.0 ns and remains at 0.0 volts until the signal returns to 1.0 volts at time≈63.0 ns. The signal remains at 1.0 volts for the remainder of the plot.

As described above with respect to FIG. 7, the logic circuit output signal presented in FIG. 8 may be supplied as input to the respective level shifters of level shifter circuit 702. FIG. 9 includes a plot 902 of an exemplary output from exemplary level shifter 744 and a plot 904 of an exemplary output from exemplary level shifter 711, described above with respect to FIG. 7. As shown in FIG. 9 by highly overlapping plots 902 and 904, the output of level shifter 744 and level shifter 711 may be nearly identical. Further, as shown in FIG. 9, the output of each of exemplary level shifter 744 and/or exemplary level shifter 711 follows the fall and rise of the logic circuit output signal presented in FIG. 8; however, the HIGH logic level may be shifted from 1.0 volts to 3.3 volts, while the LOW logic level remains at 0.0 volts. Further, as shown in FIG. 9, although the rise and fall rate of the output the respective level shifters remains very fast, approximately 1.5 ns, such a rise and fall duration may be longer than the nearly instantaneous rise and fall rate demonstrated by the logic circuit output signal presented in FIG. 8.

As described above with respect to FIG. 7, the output of the respective level shifters of level shifter circuit 702, described above with respect to FIG. 9, may be provided as input to each of first and second inverters of first driver 704. FIG. 10 includes a plot 1002 of the exemplary output of inverter 712 in response to the input signal 902 described above with respect to FIG. 9 and a plot 1004 of the exemplary output of inverter 716 in response to the input signal 904 described above with respect to FIG. 9.

As shown in FIG. 10, in response to a HIGH-to-LOW transition of signal 902, the output of inverter 712 shown at plot 1002, which may be supplied as input to p-type transistor 714 of first circuit driver 704, may rapidly, e.g., within 1 ns, rise from a LOW logic signal value of 0.0 volts to a HIGH logic signal value of 3.3 volts. As described above with respect to FIG. 7, first driver 704 may include smaller transistors that open and/or close quickly to allow driver circuit output signal SIG_OUT to meet required rise and fall time requirements. Therefore, in response to such a change in its input signal, p-type transistor 714 rapidly transitions from a CLOSED state to an OPEN state, thereby disconnecting the connection between node 729 and VDD via transistor 714.

Further, as shown in FIG. 10, in response to a HIGH-to-LOW transition of signal 904, the output of inverter 716, shown at plot 1004, which may be supplied as input to n-type transistor 718 of first circuit driver 704, rises at a rate that may be significantly slower than the output of inverter 712, shown at plot 1002. In response to such a change in its gate signal, n-type transistor 718 transitions from an OPEN state to a CLOSED state, at a rate that may be much slower than that the rate at which p-type transistor 714 transitions from a CLOSED state to an OPEN state. As a result, a period of time may be minimized during both p-type transistor 714 and n-type transistor 718 are both CLOSED, or exhibiting a relatively low resistance connection between VSS, or ground, and VDD. In this manner, the crowbar current generated by first circuit driver 704 when switching in response to a response to a HIGH-to-LOW transition of signal 902 and signal 904 may be minimized.

As further shown in FIG. 10, in response to a LOW-to-HIGH transition of signal 904, the output of inverter 716, which may be supplied as input to n-type transistor 718 of first circuit driver 704, may rapidly, e.g., within 2 ns, drop from a HIGH logic signal value of 3.3 volts to a LOW logic signal value of 0.0 volts. As described above with respect to FIG. 7, first driver 704 may include smaller transistors that open and/or close quickly to allow driver circuit output signal SIG_OUT to meet required rise and fall time requirements. Therefore, in response to such a change in its input signal, n-type transistor 718 rapidly transitions from a CLOSED state to an OPEN state, thereby disconnecting the connection between node 729 and VSS, or ground, via transistor 718.

As additionally shown in FIG. 10, in response to a LOW-to-HIGH transition of signal 902, the output of inverter 712, shown at plot 1002, supplied as input to p-type transistor 714 of first circuit driver 704, begins to slowly drop from a HIGH logic signal value of 3.3 volts to a LOW logic signal value of 0.0 volts, but the rate of drop may be significantly slower than the output of inverter 716, shown at plot 1004. In response to such a change in its input signal, p-type transistor 714 slowly transitions from an OPEN state to a CLOSED state, at a rate that may be much slower than that of the rate at which n-type transistor 718 transitioned from a closed state to an open state. As a result, a period of time may be minimized during which both p-type transistor 714 and n-type transistor 718 are both CLOSED, or exhibiting a relatively low resistance connection between VSS, or ground, and VDD. In this manner, the crowbar currents generated by first circuit driver 704 when switching in response to a response to a LOW-to-HIGH transition of signal 902 and signal 904 may be minimized.

As described above with respect to FIG. 7, first driver 704 and a second driver 706 may work together, in parallel, to generate a driver circuit output signal SIG_OUT at a circuit driver output node 729 that meets required rise and fall time requirements and that also provides robust DC drive characteristics. For example, first driver 704 may include smaller transistors that open and/or close quickly to allow driver circuit output signal SIG_OUT to meet required rise and fall time requirements, and second driver 706 may include larger transistors that open and/or close more slowly, but that are capable of allowing driver circuit output signal SIG_OUT to meet robust DC drive characteristic requirements.

As further described above with respect to FIG. 7, the output of the respective level shifters of level shifter circuit 702, described above with respect to FIG. 9, may be provided as input to each of first and second inverters of second driver 706. FIG. 11 includes a plot 1102 of the voltage at node 717, which may be positioned between the output of inverter 720 and the gate of p-type transistor 724. The voltage at node 717 may be controlled by the output of inverter 720 as well as delayed pull-down circuit 722, described above with respect to FIG. 7. FIG. 11 also includes a plot 1104 of the voltage at node 725, which may be positioned between the output of inverter 730 and the gate of n-type transistor 734. The voltage at node 725 may be controlled by the output of inverter 730 as well as delayed pull-up circuit 732, described above with respect to FIG. 7. The precise timing of the respective gate voltages of p-type transistor 724 may be based on the output of inverter 720 and delayed pull-down circuit 722. The precise timing of the respective gate voltages of n-type transistor 734 based on the output of inverter 730 and delayed pull-up circuit 732.

FIG. 12 includes a plot 1202 of the voltage at node 719 which may be positioned between the output of inverter 726 and the gate of n-type transistor 728, and which controls the opening and closing of pull-down transistor 728. FIG. 12 also includes a plot 1204 of the voltage at node 727 which may be positioned between the output of inverter 736 and the gate of p-type transistor 738, and which controls the opening and closing of pull-up transistor 738. Operation of second driver 706 is described below with respect to the control voltages at nodes 717 and 719, with respect to p-type transistor 724, and with respect to the control voltages at nodes 725 and 727, with respect to n-type transistor 734.

As shown in FIG. 11, in response to a HIGH-to-LOW transition of signal 902, the output of inverter 720, shown at plot 1102, which may be supplied as input to p-type transistor 724 of second circuit driver 706, may rise rapidly, e.g., over a period of about 7 ns, from a LOW logic signal value of 0.0 volts to a HIGH logic signal value of 3.3 volts. As described above with respect to FIG. 7, second driver 706 may include larger transistors that open and/or close more slowly than the transistors used in first driver circuit 704, but that are capable of, for example, delivering as much as 16 mA of current without degrading the voltage level of output signal SIG_OUT, thereby allowing output signal SIG_OUT to provide strong DC driving characteristics. Therefore, in response to such a rapid change in its gate voltage, p-type transistor 724 begins to transition from a CLOSED state to an OPEN state. Due to the quick rise in the voltage at node 717 based on the rapid rise in the output voltage of inverter 720, the rate at which p-type transistor transitions from a CLOSED to and OPEN state may be limited only by the speed of transistor 724.

As shown in FIG. 11, in response to a HIGH-to-LOW transition of signal 904, the output of inverter 730, shown at plot 1104, supplied as input to n-type transistor 734 of second circuit driver 706, rises at a rate that may be significantly slower than the output of inverter 720, shown at plot 1102. In response to such a change in its input signal, n-type transistor 734 begins to transition from an OPEN state to a CLOSED state, but at a rate that may be much slower than the rate at which p-type transistor 724 transitioned from a CLOSED state to an OPEN state. As a result, despite the relatively slow speed of p-type transistor 724 and n-type transistor 734 of second driver 706, when compared to p-type transistor 714 and n-type transistor 718 of first driver 704, a period of time may be minimized during which both p-type transistor 724 and n-type transistor 734 are both CLOSED, or exhibiting a relatively low resistance connection between VSS, or ground, and VDD. In this manner, the crowbar current generated by second circuit driver 706 when switching in response to a response to a HIGH-to-LOW transition of signal 902 and signal 904 may be minimized.

As shown in FIG. 11, in response to a LOW-to-HIGH transition of signal 904, the output of inverter 730 shown at plot 1104, which may be supplied as input to n-type transistor 734 of second circuit driver 706, may fall rapidly, e.g., over a period of about 3 ns, from a HIGH logic signal value of 3.3 volts to a LOW logic signal value of 0.0 volts. As described above with respect to FIG. 7, second driver 706 may include larger transistors that open and/or close more slowly that the transistors used in first driver circuit 704, but that are capable of delivering as much as 16 mA of current without degrading the voltage level of output signal SIG_OUT, thereby allowing output signal SIG_OUT to provide strong DC driving characteristics. Therefore, in response to such a rapid change in its input signal, n-type transistor 734 begins to transition from a CLOSED state to an OPEN state. Due to the quick fall in the voltage at node 725 based on the rapid fall in the output voltage of inverter 730, the rate at which n-type transistor 734 transitions from a CLOSED to an OPEN state may be limited only by the speed of transistor 734.

As shown in FIG. 11, in response to a LOW-to-HIGH transition of signal 902, the output of inverter 720, shown at plot 1102, supplied as input to p-type transistor 724 of second circuit driver 706, falls at a rate that may be significantly slower than the output of inverter 730, shown at plot 1104. In response to such a change in its gate signal, p-type transistor 724 begins to transition from an OPEN state to a CLOSED state, but at a rate that may be much slower than that the rate at which n-type transistor 734 transitioned from a CLOSED state to an OPEN state. As a result, despite the relatively slow speed of p-type transistor 724 and n-type transistor 734 of second driver 706, when compared to p-type transistor 714 and n-type transistor 718 of first driver 704, a period of time may be minimized during which both p-type transistor 724 and n-type transistor 734 are both CLOSED, or exhibiting a relatively low resistance connection between VSS, or ground, and VDD. In this manner, the crowbar current generated by second circuit driver 706 when switching in response to a response to a LOW-to-HIGH transition of signal 902 and signal 904 may be minimized.

The voltage at node 725 may be controlled by the output of inverter 730, as well as delayed pull-up circuit 732, described above with respect to FIG. 7. The voltage at node 717 may be controlled by the output of inverter 720, as well as delayed pull-down circuit 722, described above with respect to FIG. 7. The precise timing of the voltage applied to the gate of p-type transistor 724 may be based on the output of inverter 720 and delayed pull-down circuit 722. The precise timing of the voltage applied to the gate of n-type transistor 734 may be based on the output of inverter 730 and delayed pull-up circuit 732.

FIG. 12 includes a plot 1202 of the voltage at node 719 which may be positioned between the output of inverter 726 and the gate of n-type transistor 728, and which controls the opening and closing of pull-down transistor 728. FIG. 12 also includes a plot 1204 of the voltage at node 727 which may be positioned between the output of inverter 736 and the gate of p-type transistor 738, and which controls the opening and closing of p-type transistor 738. The effect of delayed pull-up circuit 732 and delayed pull-down circuit 722 on the operation of second driver 706 is described below with respect to the control voltages at nodes 717 and 719, with respect to p-type transistor 724, and with respect to the control voltages at nodes 725 and 727, with respect to n-type transistor 734.

As described above with respect to FIG. 11, in response to a HIGH-to-LOW transition of signal 904, the output of inverter 730, shown at plot 1104, supplied as input to n-type transistor 734 of second driver 706, rises at a rate that may be significantly slower than the output of inverter 720, shown at plot 1102. In this manner, the crowbar current generated by second circuit driver 706 when switching in response to a response to a HIGH-to-LOW transition of signal 902 and signal 904 may be minimized. Further, as shown in FIG. 11, in response to a LOW-to-HIGH transition of signal 902, the output of inverter 720, shown at plot 1102, supplied as input to p-type transistor 724 of second circuit driver 706, falls at a rate that may be significantly slower than the output of inverter 730 in response to a LOW-to-HIGH transition of signal 904, as shown at plot 1104. In this manner, the crowbar current generated by second circuit driver 706 when switching in response to a response to a LOW-to-HIGH transition of signal 902 and signal 904 may be minimized.

However, in a response to a HIGH-to-LOW transition of signal 902, the possibility of generating a crowbar current may be eliminated once p-type transistor 724 is fully OPEN; and in a response to a LOW-to-HIGH transition of signal 902, the possibility of generating a crowbar current is eliminated once n-type transistor 734 is fully OPEN. Further, in order for second driver 706 to serve its role in providing strong DC driving characteristics, n-type transistor 734 should be fully CLOSED following a HIGH-to-LOW transition of signal DATA_OUT 802 and p-type transistor 724 should be fully CLOSED following a LOW-to-HIGH transition of signal DATA_OUT 802. Therefore, delayed pull-up circuit 732 may be configured so that once sufficient time has elapsed for p-type transistor 724 to OPEN in a response to a HIGH-to-LOW transition of signal DATA_OUT 802, transistor 738 may be CLOSED to form a connection between VDD and node 725, so that the slowly rising voltage at node 725, shown in plot 1104 at approximately 5 ns to 50 ns, may be quickly pulled up to a HIGH level, e.g., 3.3 volts, and n-type transistor 734 may be fully closed forming a strong connection between node 729 and VSS, or ground. In this manner, with transistor 724 fully OPEN, output signal SIG_OUT may be held firmly in a LOW state. Further, delayed pull-down circuit 722 may be configured so that once sufficient time has elapsed for n-type transistor 734 to fully OPEN in a response to a LOW-to-HIGH transition of signal DATA_OUT 802, n-type transistor 728 may be CLOSED to form a connection between node 717 and VSS, or ground, so that the slowly falling voltage at node 717 may be quickly pulled down to a LOW level, e.g., 0.0 volts, and p-type transistor 724 may be fully closed forming a strong connection between HIGH signal source VDD and node 729. In this manner, with transistor 734 fully OPEN, output signal SIG_OUT may be held firmly in a HIGH state.

In view of the above description, operation of delayed pull-down circuit 722 and delayed pull-up circuit 732, and their respective impact on the operations of second driver 706, may be described with respect to FIG. 7, FIG. 11 and FIG. 12.

First, operation of delayed pull-up circuit 732 will be described with respect to a transition from HIGH-to-LOW of signal DATA_OUT 802. As shown in FIG. 7, the output of inverter 736 may be connected to the gate of transistor 738 and, hence, the output of inverter 736 controls whether transistor 738 is OPEN or CLOSED. However, as shown in FIG. 7, the input lead of inverter 736 may be connected to the output of inverter 730 and, hence, the output of inverter 736 can change only once the output of inverter 730 exceeds a transistor threshold value that causes inverter 736 to changes states. For example, as shown in FIG. 11 and FIG. 12, as the output voltage of inverter 730, shown by plot 1104 slowly rises, the output of inverter 736, shown by plot 1204 remains at a relatively constant HIGH value; however, when the output of inverter 730 reaches 1.2 volts, a threshold value of inverter 736 may be met and the output of inverter 736 transitions, as shown in FIG. 12 at approximately the 53.0 ns, from HIGH to LOW. As a result, p-type transistor 738 may be CLOSED to form a connection between VDD and node 725, so that the slowly rising voltage at node 725 may be quickly pulled up to a HIGH level, e.g., 3.3 volts, and n-type transistor 734 may be fully CLOSED forming a strong connection between node 729 and VSS, or ground. In this manner, with transistor 724 fully OPEN, output signal SIG_OUT may be held firmly in a LOW state.

Next, operation of delayed pull-down circuit 722 will be described with respect to a transition from LOW-to-HIGH of signal DATA_OUT 802. As further shown in FIG. 7, the output of inverter 726 may be connected to the gate of n-type transistor 728 and, hence, the output of inverter 726 controls whether transistor 728 is OPEN or CLOSED. However, as shown in FIG. 7, the input lead of inverter 726 may be connected to the output of inverter 720 and, hence, the output of inverter 726 can change only once the output of inverter 720 exceeds a transistor threshold value that causes inverter 726 to change states. For example, as shown in FIG. 11 and FIG. 12, at approximately 65 ns to approximately 133.0 ns, as the output voltage of inverter 720, shown by plot 1102 slowly decreases, the output of inverter 726, shown by plot 1202 remains at a relatively constant LOW value; however, when the output of inverter 720 lowers to 1.2 volts, a threshold value of inverter 726 may be met and the output of inverter 726 transitions, as shown in FIG. 12 at plot 1202 at approximately 133.0 ns to 135.0 ns, from LOW to HIGH. As a result, n-type transistor 728 may be CLOSED to form a connection between node 717 and VSS, or ground, so that the slowly falling voltage at node 717 may be quickly pulled down to a LOW level, e.g., 0.0 volts, and p-type transistor 724 may be fully CLOSED forming a strong connection between node 729 and HIGH signal source VDD, at 3.3 volts. In this manner, with transistor 734 fully OPEN, output signal SIG_OUT may be held firmly in a HIGH state, and circuit driver 706 may serve its role in providing strong DC driving characteristics providing, for example, as much 16 mA of current to a load over a transmission line without affecting the signal level voltage of output signal SIG_OUT.

Figure 1:
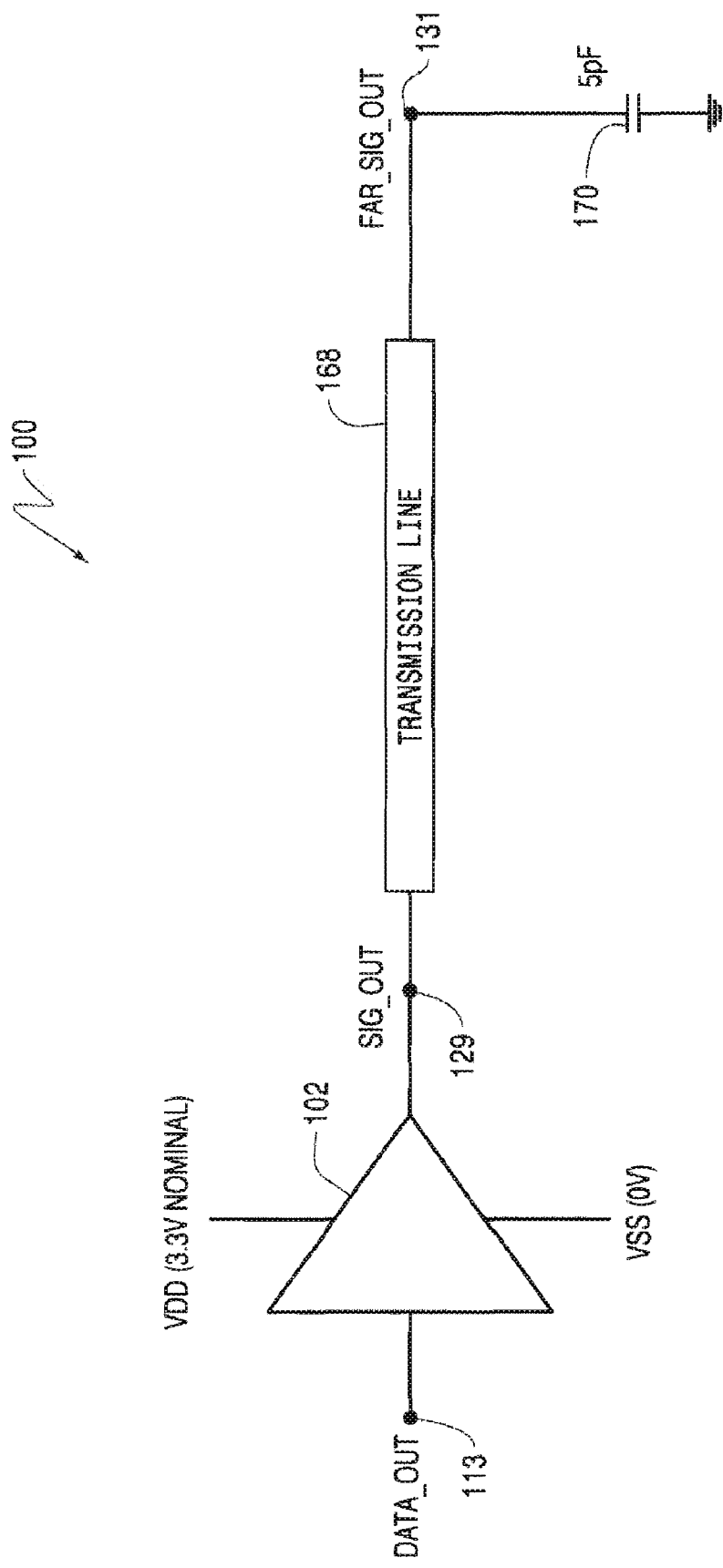
FIG. 1 is a schematic of an exemplary driver circuit connected via a transmission line to an exemplary driven load.
Figure 2:
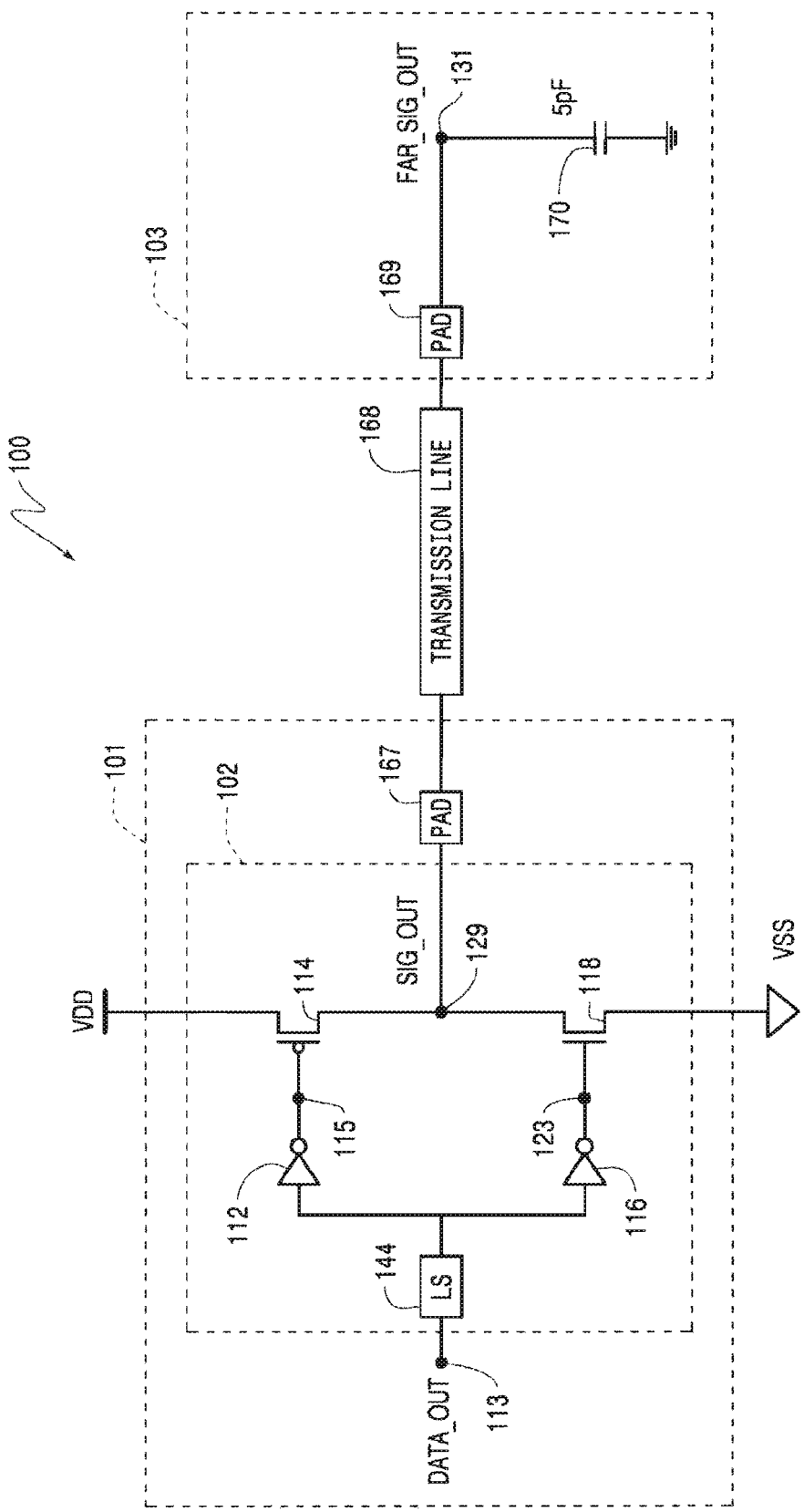
FIG. 2 is a more detailed schematic diagram of the exemplary circuit presented in FIG. 1.
Figure 3:
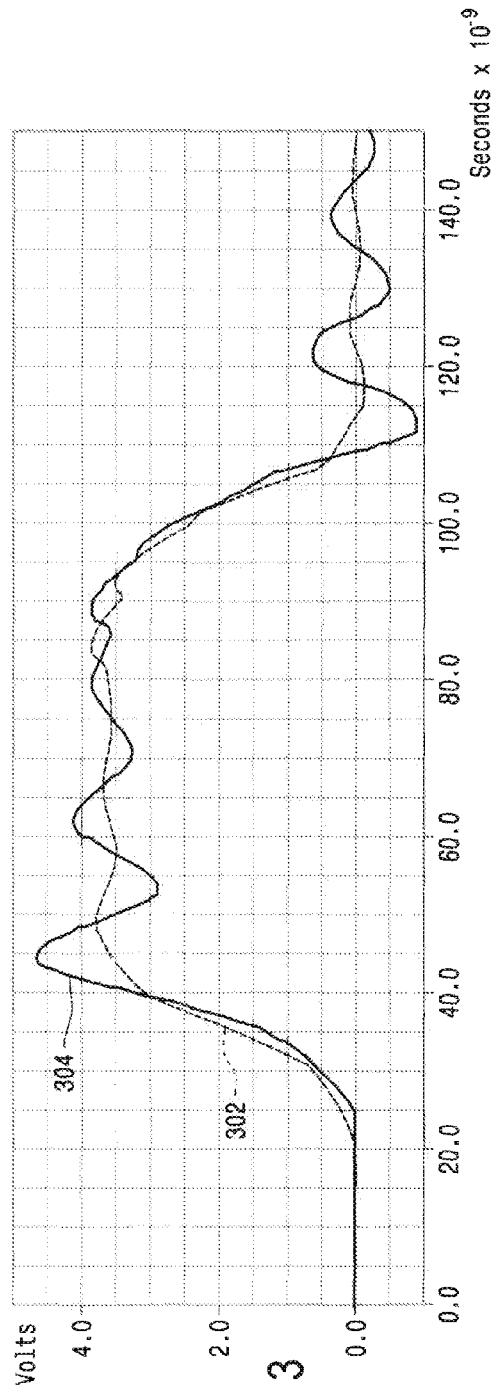
FIG. 3 is a plot of exemplary driver circuit output signals representative of an exemplary driver circuit, such as the driver circuit presented in FIG. 2, implemented using metal-oxide-semiconductor (MOS) 130 nm integrated circuit technology, during a LOW-to-HIGH and HIGH-to-LOW switching cycle.
Figure 4:
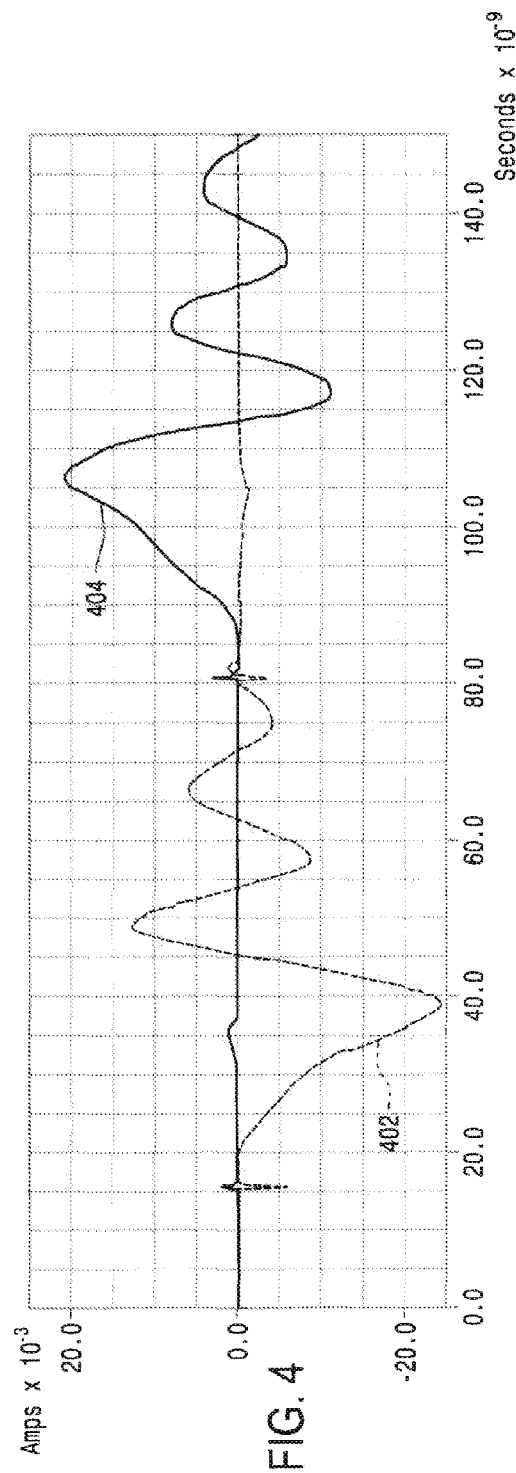
FIG. 4 is a plot of exemplary crowbar current generated by an exemplary driver circuit, such as the driver circuit presented in FIG. 2, implemented using metal-oxide-semiconductor (MOS) 130 nm integrated circuit technology, during a LOW-to-HIGH and HIGH-to-LOW switching cycle.

FIG. 13 includes a plot 1302 of exemplary driver circuit output signal SIG_OUT that may be generated by the exemplary embodiment of slew rate controlled circuit driver 700 at node 729, and a plot 1304 of exemplary driver circuit output signal FAR_SIG_OUT as may be generated by an exemplary circuit embodiment at a far end of a transmission line connected to node 729, as described below with respect to FIG. 15. As shown in FIG. 13, output signals SIG_OUT and FAR_SIG_OUT may be nearly identical. Neither signal suffers from the oscillating distortions nor the high frequency distortions described above with respect to FIG. 3 and FIG. 5.

FIG. 14 is a plot of an exemplary crowbar current that may be generated by the exemplary a slew rate controlled driver 700 described above with respect to FIGS. 7-13, during an exemplary HIGH-to-LOW and LOW-to-HIGH switching cycle. As shown in FIG. 14, the generated crowbar current may be low, e.g., approximately 0.0 mA.

Figure 15:
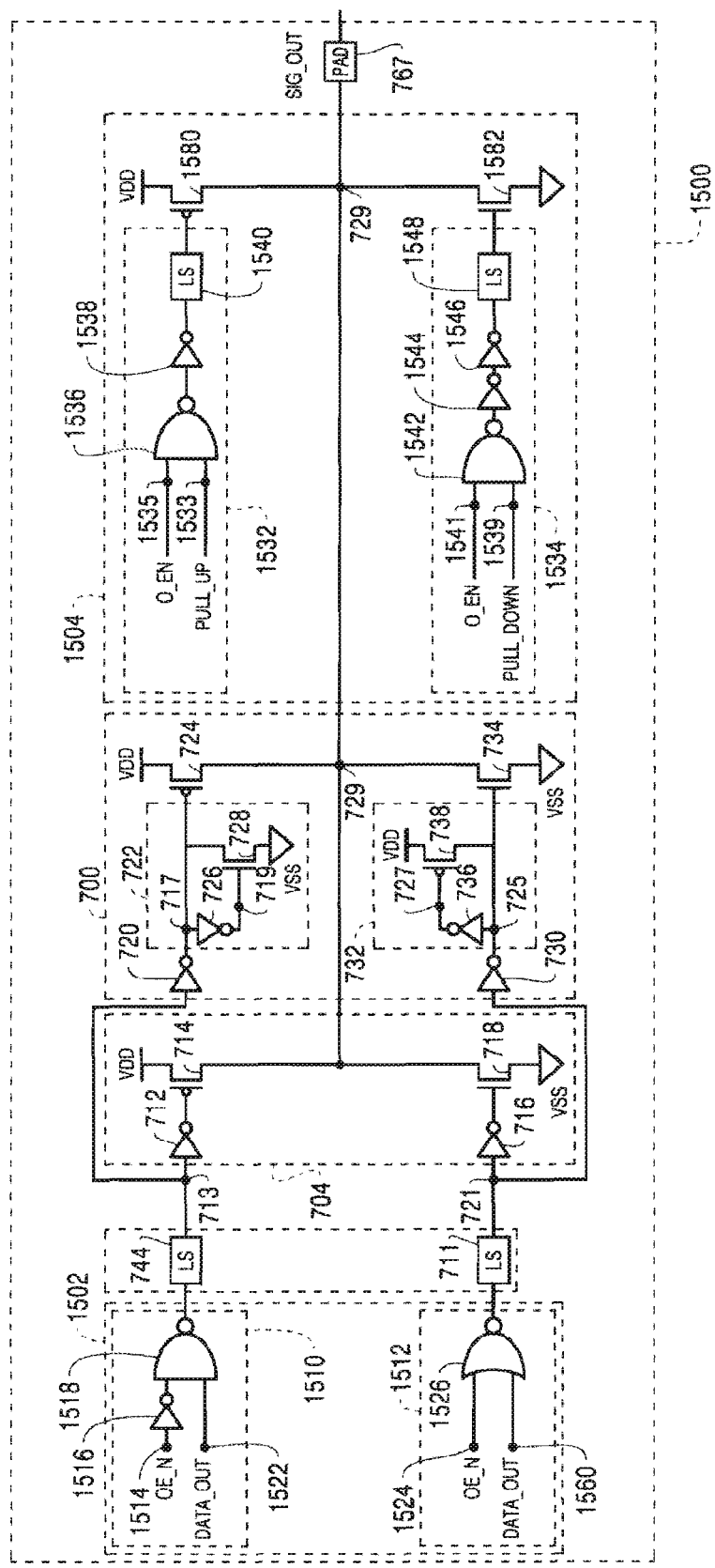
FIG. 15 is a circuit diagram of an exemplary integrated circuit that includes the slew rate controlled driver of FIG. 7.

FIG. 15 is a circuit diagram of an exemplary embodiment of a slew rate controlled circuit driver 700 as may be implemented within an exemplary integrated circuit 1500 to support communication over a transmission line. As shown in FIG. 15, slew rate controlled circuit driver 700 may be included within an integrated circuit between a binary logic circuit and a transmission line pad. For example, in the exemplary embodiment slew rate controlled circuit driver 700 described above, slew rate controlled circuit driver 700 may receive a binary logic circuit output signal and may generate a corresponding binary output signal that switches between a DC level of 0.0 volts and a DC level of 3.3 volts and may be relied on to supply a current as high as 16 mA without degrading the DC voltage signal levels. Such a signal may be sufficiently strong to drive an external load associated with another circuit across a transmission line.

As shown in FIG. 15, integrated circuit 1500 may include a data logic circuit 1502, a pull-up/pull-down circuit 1504, a slew rate controlled circuit driver 700, as described above with respect to FIGS. 7-14, and an output pad 767. Circuit 1500 may generate at node 729 a driver circuit output signal SIG_OUT. Although not shown in FIG. 15, node 729 may be connected via an output pad and a transmission line to an input pad within an other circuit. In this manner, driver circuit output signal SIG_OUT may be received by the other circuit.

Exemplary data logic circuit 1502 may include a plurality of logic subcircuits. For example, exemplary data logic circuit 1502 includes two logic subcircuits, first logic subcircuit 1510 and second logic subcircuit 1512.

First logic subcircuit 1502 may include an inverter 1516 having an input lead and an output lead and a NAND gate 1518 having a first input lead, a second input lead and an output lead. The input lead of inverter 1516 may be connected to node 1514 and the output lead of inverter 1516 may be connected to a first input lead of NAND gate 1518. The second input lead of NAND gate 1518 may be connected to node 1522. The output lead of NAND gate 1518 may be connected to the input of a level shifter, e.g., level shifter 744 of level shifting circuit 702, as described above with respect to FIG. 7.

Second logic subcircuit 1512 may include a NOR gate 1526 having a first input lead, a second input lead and an output lead. The first input lead of NOR gate 1526 may be connected to node 1524. The second input lead of NOR gate 1526 may be connected to node 1530. The output lead of NOR gate 1526 may be connected to the input of a level shifter, e.g., level shifter 711 of level shifting circuit 702, as described above with respect to FIG. 7.

In operation, first logic subcircuit 1510 may receive signal O_EN on node 1514 and signal DATA_OUT on node 1522. Second logic subcircuit 1512 may receive signal O_EN on node 1524 and signal DATA_OUT on node 1560. As described in Table 1, below, so long as signal O_EN remains a signal of value zero, the output signal passed by first logic subcircuit 1510 and the output signal passed by second logic subcircuit 1512 may remain the same, for example, as shown in FIG. 9 with respect to plot 902 and plot 904. Despite the use of different logic circuits, the input signals received at node 713 and node 721, respectively, may be identical.

In some exemplary embodiments, the use of different logic circuits to achieve the same logical output may be used to introduce and/or to balance out timing issues related to components delays encountered elsewhere in circuit 1500. In other exemplary embodiments of circuit 1500, the first logic subcircuit 1510 and second logic subcircuit 1512 may be identical, and/or both circuits may be replaced by a single logic circuit and used to feed a level shifting circuit 702 with a single level shifter.

Pull-up/pull-down circuit 1504 may connected to circuit driver 700 at node 729. As shown in FIG. 15, Pull-up/pull-down circuit 1504 may include pull-up circuit 1532 and pull-down 1534. Further, pull-up/pull-down circuit 1504 may include a p-type transistor 1580 and an n-type transistor 1582. One of a source and drain of p-type transistor 1580 may connect to a HIGH signal source voltage VDD and the other of the source and drain of p-type transistor 1580 may connect to driver circuit output node 729. One of a source and drain of n-type transistor 1582 may connect to driver circuit output node 729 and the other of the source and drain of n-type transistor 1582 may connect to a LOW signal source voltage VSS. An output lead of pull-up circuit 1532 may connect to the gate of p-type transistor 1580. An output lead of pull-down circuit 1534 may connect to the gate of n-type transistor 1582.

Further, pull-up circuit 1532 may include a NAND gate 1536 having a first input lead, a second input lead and an output lead, an inverter 1538 having a input lead and an output lead and a level shifter 1540 having a input lead and an output lead. The first input lead of NAND gate 1536 may be connected to node 1535 which may be connected to output enable signal O_EN. The second input lead of NAND gate 1536 may be connected to node 1533 which may be connected to pull-up control signal PULL_UP. The output lead of NAND gate 1536 may be connected to the input of inverter 1538, the output of inverter 1358 may be connected to the input of level shifter 1540 and the output of level shifter 1540, i.e., the output of pull-up circuit 1532, may be connected to the gate of p-type transistor 1580.

For example, pull-down circuit 1534 may include a NAND gate 1542 having a first input lead, a second input lead and an output lead, a first inverter 1544 having a input lead and an output lead, a second inverter 1546 having a input lead and an output lead and a level shifter 1548 having a input lead and an output lead. The first input lead of NAND gate 1542 may be connected to node 1541 which may be connected to output enable signal O_EN. The second input lead of NAND gate 1536 may be connected to node 1539 which may be connected to pull-down control signal PULL_DOWN. The output lead of NAND gate 1542 may be connected to the input of inverter 1544, the output of inverter 1544 may be connected to the input of inverter 1546, the output of inverter 1546 may be connected to the input of level shifter 1548 and the output of level shifter 1548, i.e., the output of pull-down circuit 1534, may be connected to the gate of n-type transistor 1582.

As addressed above, data logic circuit 1502 may be activated to submit logic circuit output signals to driver circuit 700 by setting output enable signal O_EN to a LOW binary logic value, e.g., logical 0. In this manner exemplary logic circuits 1510 and 1512, receiving the same values from logic circuit output signal DATA_OUT may produce equivalent results at nodes 713 and 721 for use by driver circuit 700.

Output enable signal O_EN may be used to determine whether the voltage level of output signal SIG_OUT is controlled by circuit driver 700, or pull-up/pull-down circuit 1504, as summarized in Table 1, below. Note, when output enable is set to LOW, pull-up/pull-down circuit 1504 may be deactivated and circuit driver 700 may control output signal SIG_OUT; however, when output enable is set to HIGH, circuit driver 700 may be deactivated and pull-up/pull-down circuit 1504 may control output signal SIG_OUT.

Similarly, pull-up/pull-down circuit 1504 may be activated to execute one of a pull-up and pull-down of the voltage at node 729 of driver circuit 700 by setting output enable signal O_EN to a HIGH binary logic value, e.g., logical 1, and setting pull-up signal PULL_UP and pull-down signal PULL-DOWN with appropriate logical values. For example, to execute a pull-up of the voltage at node 729 of driver circuit 700, signal O_EN may be set to HIGH, PULL_UP may be set to HIGH, and PULL-DOWN may be set to LOW; to execute a pull-down of the voltage at node 729 of driver circuit 700, signal O_EN may be set to HIGH, PULL_UP may be set to LOW, and PULL-DOWN may be set to HIGH. To deactivate pull-up/pull-down circuit 1504, O_EN may be set to LOW. Table 1, below provides a truth table for exemplary pull-up circuit 1532 and exemplary pull-down 1534.

In operation, first logic subcircuit 1502 may receive signal O_EN on node 1514 and signal DATA_OUT on node 1522. Second logic subcircuit 1512 may receive signal O_EN on node 1524 and signal DATA_OUT on node 1530. So long as signal O_EN remains a signal of value zero, the output signal passed by first logic subcircuit 1502 and second logic subcircuit 1512 may remain the same, for example, as shown in FIG. 9 with respect to plot 902 and plot 904. Despite the use of different logic circuits, the input signals received at node 713 and node 712, respectively may be identical.

Pull-up/pull-down circuit 1504 may be used to pull-up or pull-down the voltage level of output signal SIG_OUT based on the values presented in Table 1, below. Note, when output enable is set to LOW, pull-up/pull-down circuit 1504 may be deactivated and circuit driver 700 may control output signal SIG_OUT; however, when output enable is set to HIGH, circuit driver 700 may be deactivated and pull-up/pull-down circuit 1504 may control output signal SIG_OUT. Table 1 provides a truth table that summarizes whether the output signal SIG_OUT is controlled by circuit driver 700 or pull-up/pull-down circuit 1504.

TABLE 1

| O_EN | DATA_OUT | PULL_UP | PULL_DOWN | SIG_OUT |
|---|---|---|---|---|
| LOW | HIGH | X | X | HIGH |
| LOW | LOW | X | X | LOW |
| HIGH | X | HIGH | LOW | HIGH |
| HIGH | X | LOW | HIGH | LOW |

X = DON'T CARE

Figure 16:
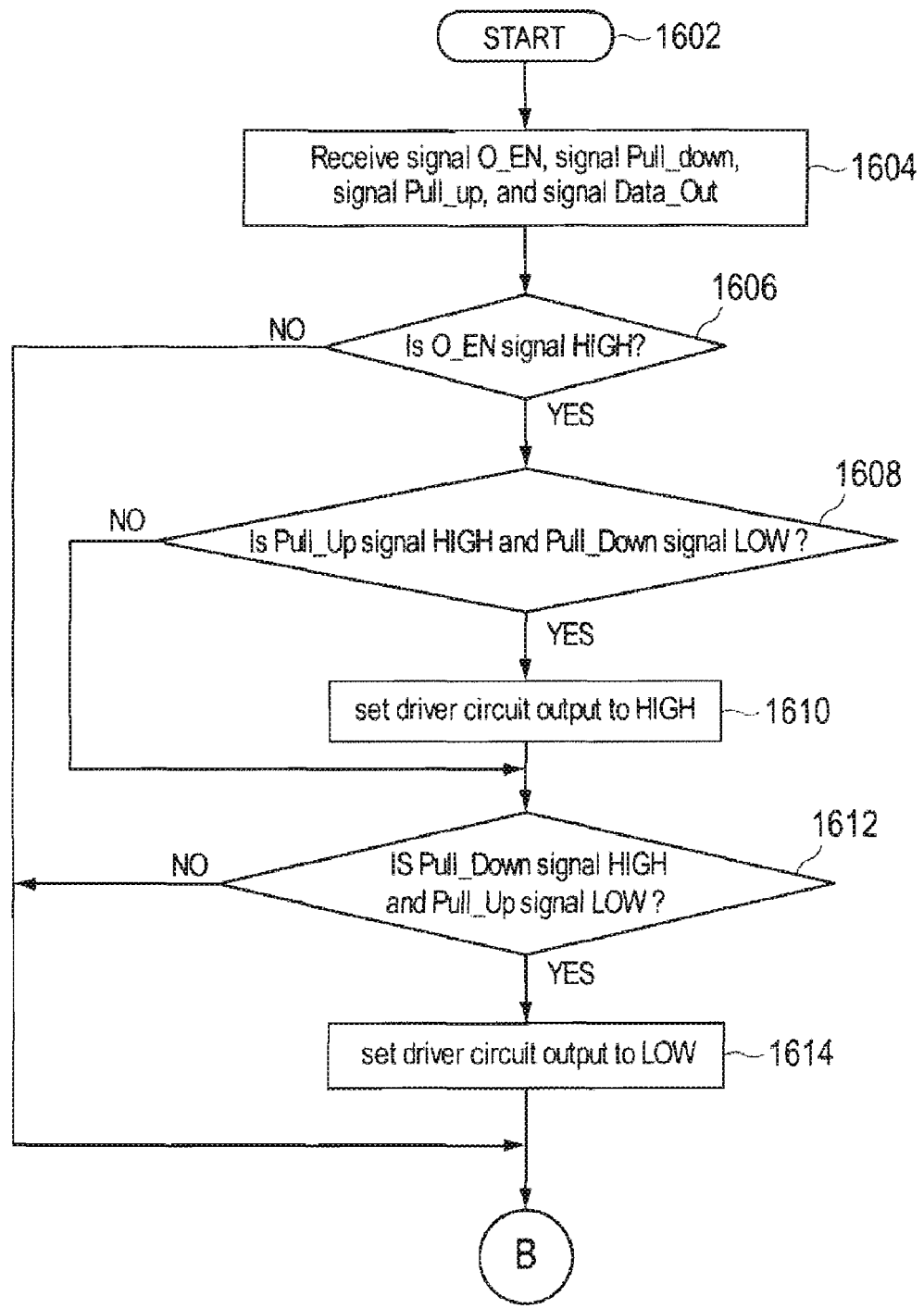

FIG. 16 and FIG. 17 are a flow diagram representing the processing performed by slew rate controlled circuit driver 700 to generate circuit driver output signal SIG_OUT at a circuit driver output node 729 in response to logic circuit output signal, DATA_OUT.

As shown in FIG. 16 and FIG. 17, the described process begins at step S1602 and proceeds to step S1604.

In step S1604, output enable signal O_EN, control signal Pull_Down, control signal Pull_Up, and logic circuit output signal Data_Out, may be received by an exemplary circuit that includes slew rate controlled circuit driver 700, as shown in FIG. 15, and operation of the method continues to step S1606.

If, in step S1606, output enable signal O_EN is HIGH, operation of the method continues to step S1608, otherwise, operation of the method continues to step S1616.

If, in step S1608, control signal Pull_Up is HIGH and control signal Pull_Down is LOW, the output of slew rate controlled circuit driver 700 is set to HIGH in step S1610, and operation of the method continues to step S1612, otherwise, operation of the method merely continues to step S1612.

In, in step S1612, control signal Pull_Down is HIGH and control signal Pull_Up is LOW, the output of slew rate controlled circuit driver 700 is set to LOW in step S1614, and operation of the method continues to step S1616, otherwise, operation of the method merely continues to step S1616.

If, in step S1616, output enable signal O_EN is LOW, operation of the method continues to step S1618, otherwise, operation of the method continues to step S1640, an the process may repeat.

In step S1618, the binary signal value of O_EN and signal Data_Out may be processed by data logic circuit 1502 to produce a NAND output, further, the binary signal value of O_EN and signal Data_Out may be processed by data logic circuit 1502 to produce a NOR output, and operation of the method continues to step S1620.

In step S1620, the NAND output and the NOR output generated in step S1618 may be level shifted, and operation of the method continues to step S1622.

In step S1622, the level shifted NAND output generated in step S1620 may be supplied to the input lead of inverter 712 and to the input lead of inverter 720, and the level shifted NOR output generated in step S1620 may be supplied to the input lead of inverter 716 and to the input lead of inverter 730, and operation of the method continues to step S1624.

If, in step S1624, signal Data_Out has transitioned from HIGH to LOW, operation of the method continues to step S1626, otherwise, operation of the method continues to step S1632.

In step S1626, the gate voltage of p-type transistor 714 may be controlled, e.g., based on characteristics of inverter 712, to rise faster than gate voltage of n-type transistor 718, which may be controlled based on characteristics of inverter 716. Further, the gate voltage of p-type transistor 724 may be controlled, based on characteristics of inverter 720, to rise faster than gate voltage of n-type transistor 734, which may be controlled based on characteristics of inverter 730 and slower than gate voltage of transistor 714, and operation of the method continues to step S1628.

If, in step S1628, sufficient time has passed for transistor 714 to OPEN, transistor 724 to OPEN and transistor 718 to CLOSE, operation of the method continues to step S1630, otherwise, operation of the method returns to step S1626.

In step S1630, gate voltage of n-type transistor 734 may be pulled to HIGH with pull-up circuit 732, thereby causing n-type transistor to CLOSE, and thereby setting the output of slew rate controlled circuit driver 700 to be set to LOW, and operation of the method continues to step S1632.

If, in step S1632, signal Data_Out has transitioned from LOW to HIGH, operation of the method continues to step S1634, otherwise, operation of the method continues to step S1640.

In step S1634, the gate voltage of n-type transistor 718 may be controlled, e.g., based on characteristics of inverter 716, to fall faster than gate voltage of p-type transistor 714, which may be controlled based on characteristics of inverter 712. Further, the gate voltage of n-type transistor 734 may be controlled, based on characteristics of inverter 730, to fall faster than gate voltage of p-type transistor 724, which may be controlled based on characteristics of inverter 720 and slower than gate voltage of transistor 718, and operation of the method continues to step S1636.

If, in step S1636, sufficient time has passed for transistor 718 to OPEN, transistor 734 to OPEN and transistor 712 to CLOSE, operation of the method continues to step S1638, otherwise, operation of the method returns to step S1640.

In step S1638, gate voltage of p-type transistor 724 may be pulled to LOW with pull-up circuit 722, thereby causing p-type transistor to CLOSE, and thereby setting the output of slew rate controlled circuit driver 700 to be set to HIGH, and operation of the method continues to step S1640.

In step S1640, operation of the method returns to step S1604, and the process repeats.

For purposes of explanation, in the above description, numerous specific details are set forth in order to provide a thorough understanding of the described slew rate controlled circuit driver. It will be apparent, however, to one skilled in the art that the slew rate controlled circuit driver may be practiced without these specific details. In other instances, well-known structures and devices are shown in block diagram form in order to avoid obscuring the features of the slew rate controlled circuit driver.

While the slew rate controlled circuit driver has been described in conjunction with the specific embodiments thereof, it is evident that many alternatives, modifications, and variations will be apparent to those skilled in the art. Accordingly, embodiments of the slew rate controlled circuit driver as set forth herein are intended to be illustrative, not limiting. There are changes that may be made without departing from the spirit and scope of the invention.

What is claimed is:

1. A driver circuit, comprising:
   a first driver comprising:
      a first inverter with a first inverter input lead and a first inverter output lead;
      a first p-type transistor, one of a source and a drain of the first p-type transistor connected to a HIGH voltage source, the other of the source and the drain of the first p-type transistor connected to a driver output node, the gate of the first p-type transistor connected to the first inverter output lead;
      a pull-down circuit comprising:
         a second inverter with a second inverter input lead and a second inverter output lead, the second inverter input lead connected to the first inverter output lead;
         a first n-type transistor, one of a source and a drain of the first n-type transistor connected to the first inverter output lead, the other of the source and the drain of the first n-type transistor connected to a LOW voltage source, the gate of the first n-type transistor connected to the second inverter output lead;
      a third inverter with a third inverter input lead and a third inverter output lead;
      a second n-type transistor, one of a source and a drain of the second n-type transistor connected to the driver output node, the other of the source and the drain of the second n-type transistor connected to the LOW voltage source, the gate of the second n-type transistor connected to the third inverter output lead; and
      a delayed pull-up circuit comprising:
         a fourth inverter with a fourth inverter input lead and a fourth inverter output lead, the fourth inverter input lead connected to the third inverter output lead; and
         a second p-type transistor, one of a source and a drain of the second p-type transistor connected to the third inverter output lead, the other of the source and the drain of the second p-type transistor connected to the HIGH voltage source, the gate of the second p-type transistor connected to the fourth inverter output lead.

2. A driver circuit of claim 1, further comprising:
   a second driver comprising:
      a fifth inverter with a fifth inverter input lead and a fifth inverter output lead, the fifth inverter input lead connected to the first inverter input lead;
      a third p-type transistor, one of a source and a drain of the third p-type transistor connected to the HIGH voltage source, the other of the source and the drain of the third p-type transistor connected to the driver output node, the gate of the third p-type transistor connected to the fifth inverter output lead;
      a sixth inverter with a sixth inverter input lead and a sixth inverter output lead, the sixth inverter input lead connected to the third inverter output lead; and
      a third n-type transistor, one of a source and a drain of the third n-type transistor connected to the driver output node, the other of the source and the drain of the third n-type transistor connected to a LOW voltage source, the gate of the third n-type transistor connected to the sixth inverter output lead.

3. The driver circuit of claim 2, further comprising:
   a level shifter circuit comprising:
      a first level shifter with a first level shifter input and a first level shifter output that is connected to the fifth inverter input lead.

4. The driver circuit of claim 2, further comprising:
   a level shifter circuit comprising:
      a first level shifter with a first level shifter input and a first level shifter output that is connected to the fifth inverter input lead; and
      a second level shifter with a second level shifter input and a second level shifter output that is connected to the sixth inverter input lead.

5. The driver circuit of claim 3, further comprising:
   a data logic circuit, comprising:
      a first logic subcircuit with a first logic subcircuit input and a first logic subcircuit output, the first logic subcircuit output connected to the first level shifter input.

6. The driver circuit of claim 5,
   wherein the first logic subcircuit receives an output enable signal and a data output signal and generates a logic circuit output signal based on the received output enable signal and received data output signal that is provided to the first level shifter input.

7. The driver circuit of claim 4, further comprising:
   a data logic circuit, comprising:
      a first logic subcircuit with a first logic subcircuit input and a first logic subcircuit output, the first logic subcircuit output connected to the first level shifter input; and
      a second logic subcircuit with a second logic subcircuit input and a second logic subcircuit output, the second logic subcircuit output connected to the second level shifter input.

8. The driver circuit of claim 7,
   wherein the first logic subcircuit receives an output enable signal and a data output signal and generates a logic circuit output signal based on the received output enable signal and received data output signal that is provided to the first level shifter input, and the second logic subcircuit receives the output enable signal and the data output signal and generates a logic circuit output signal based on the received output enable signal and received data output signal that is provided to the second level shifter input.

9. The driver circuit of claim 2, further comprising:
   a pull-up/pull-down circuit with a pull-up/pull-down circuit input lead and a pull-up/pull-down circuit output lead, the pull-up/pull-down circuit output lead connected to the driver output node.

10. The driver circuit of claim 9, the pull-up/pull-down circuit further comprising:
    a pull-up circuit with a pull-up circuit input and a pull-up circuit output, the pull-up circuit output connected to the driver output node; and
    a pull-down circuit with a pull-down circuit input and a pull-down circuit output, the pull-down circuit output connected to the driver output node.

11. The driver circuit of claim 10,
    wherein the pull-up circuit input includes a first lead that receives an output enable signal and includes a second lead that receives a data signal; and the pull-down circuit input includes a first lead that receives an output enable signal and includes a second lead that receives a data signal.

12. The driver circuit of claim 1, further comprising:
an output pad connected to the driver output node that is used to connect a transmission line to the driver circuit.

13. A driver circuit that generates a driver output signal based on a logic circuit output signal, the driver circuit, comprising:
a first driver that controls a voltage rise time and a voltage fall time of the generated output signal, the first driver comprising:
a first inverter with a first inverter input lead and a first inverter output lead; and
a second inverter with a second inverter input lead and a second inverter output lead; and
a second driver that controls an amount of current that is delivered via the generated output signal,
wherein both the first driver and the second driver operate in parallel, driven by the logic circuit output signal, each of the first driver and the second driver contributing to the driver output signal generated at a driver output node, and a rise time of an output of the first inverter is faster than a rise time of an output of the second inverter.

14. The driver circuit of claim 13, wherein the first driver further comprises:
a first p-type transistor, one of a source and a drain of the first p-type transistor connected to a HIGH voltage source, the other of the source and the drain of the first p-type transistor connected to the driver output node, the gate of the first p-type transistor connected to the first inverter output lead; and
a first n-type transistor, one of a source and a drain of the first n-type transistor connected to the driver output node, the other of the source and the drain of the first n-type transistor connected to a LOW voltage source, the gate of the first n-type transistor connected to the second inverter output lead.

15. The driver circuit of claim 13, wherein a fall time of the output of the second inverter is faster than a fall time of the output of the first inverter.

16. The driver circuit of claim 14, wherein the second driver further comprises:
a third inverter with a third inverter input lead and a third inverter output lead, the third inverter input lead connected to the first inverter input lead;
a second p-type transistor, one of a source and a drain of the second p-type transistor connected to the HIGH voltage source, the other of the source and the drain of the second p-type transistor connected to the driver output node, the gate of the second p-type transistor connected to the third inverter output lead;
a fourth inverter with a fourth inverter input lead and a fourth inverter output lead the fourth inverter input lead connected to the second inverter input lead; and
a second n-type transistor, one of a source and a drain of the second n-type transistor connected to the driver output node, the other of the source and the drain of second n-type transistor connected to the LOW voltage source, the gate of the second n-type transistor connected to the fourth inverter output lead.

17. The driver circuit of claim 16, wherein a rise time of an output of the third inverter is faster than a rise time of an output of the fourth inverter.

18. The driver circuit of claim 17, wherein a fall time of the output of the fourth inverter is faster than a fall time of the output of the third inverter.

19. The driver circuit of claim 17, wherein a rise time of an output of the third inverter is slower than a rise time of an output of the first inverter.

20. The driver circuit of claim 17, wherein a fall time of the output of the fourth inverter is slower than a fall time of the output of the second inverter.

21. The driver circuit of claim 20, wherein the second driver further comprises:
a pull-down circuit connected to the output of the third inverter, the pull-down circuit being driven by the output of the third inverter and when activated pulls down the voltage of the output of the third inverter, thereby closing the second p-type transistor.

22. The driver circuit of claim 20, wherein the second driver further comprises:
a delayed pull-up circuit connected to the output of the fourth inverter, the delayed pull-up circuit being driven by the output of the fourth inverter and when activated pulls up the voltage of the output of the fourth inverter, thereby closing the second n-type transistor.

23. A method of generating a driver output signal based on a logic circuit output signal, the method, comprising:
controlling, with a first driver, a voltage rise time and a voltage fall time of the generated output signal, wherein the first driver includes:
a first inverter with a first inverter input lead and a first inverter output lead; and
a second inverter with a second inverter input lead and a second inverter output lead;
controlling a rise time of an output of the first inverter so that the rise time of the output of the first inverter is faster than a rise time of an output of the second inverter;
controlling, with a second driver, an amount of current that is delivered via the generated output signal; and
operating the first driver and the second driver in parallel, based on the logic circuit output signal, each of the first driver and the second driver contributing to the driver output signal generated at a driver output node.

24. The method of claim 23, wherein the first driver further comprises:
a first p-type transistor, one of a source and a drain of the first p-type transistor connected to a HIGH voltage source, the other of the source and the drain of the first p-type transistor connected to the driver output node, the gate of the first p-type transistor connected to the first inverter output lead; and
a first n-type transistor, one of a source and a drain of the first n-type transistor connected to the driver output node, the other of the source and the drain of the first n-type transistor connected to a LOW voltage source, the gate of the first n-type transistor connected to the second inverter output lead.

25. The method of claim 23, the method further comprising,
controlling a fall time of the output of the second inverter so that the fall time of the output of the second inverter is faster than a fall time of the output of the first inverter.

26. The method of claim 24, wherein the second driver includes a third inverter with a third inverter input lead and a third inverter output lead, a second p-type transistor, one of a source and a drain of the second p-type transistor connected to a HIGH voltage source, the other of the source and the drain of the second p-type transistor connected to the driver output node, the gate of the second p-type transistor connected to the third inverter output lead, a fourth inverter with a fourth inverter input lead and a fourth inverter output lead, and a second n-type transistor, one of a source and a drain of the second n-type transistor connected to the driver output node, the other of the source and the drain of second n-type transistor connected to the LOW voltage source, the gate of the second n-type transistor connected to the fourth inverter output lead, the method further comprising:

controlling a rise time of an output of the third inverter so that the rise time of an output of the third inverter is faster than a rise time of an output of the fourth inverter.

27. The method of claim 26, the method further comprising:

controlling a fall time of the output of the fourth inverter so that a fall time of the output of the fourth inverter is faster than a fall time of the output of the third inverter.

28. The method of claim 26, the method further comprising:

controlling a rise time of an output of the third inverter so that the rise time of an output of the third inverter is slower than a rise time of an output of the first inverter.

29. The method of claim 26, the method further comprising:

controlling a fall time of the output of the third inverter so that the fall time of the output of the fourth inverter is slower than a fall time of the output of the second inverter.

30. A driver circuit that generates a driver output signal based on a logic circuit output signal, the driver circuit, comprising:

a first means for controlling a voltage rise time and a voltage fall time of the generated output signal comprising:
  a first inverter with a first inverter input lead and a first inverter output lead; and
  a second inverter with a second inverter input lead and a second inverter output lead;
means for controlling a rise time of an output of the first inverter so that the rise time of the output of the first inverter is faster than a rise time of an output of the second inverter;
a second means for controlling an amount of current that is delivered via the generated output signal; and
means for operating the first means and the second means in parallel, based on the logic circuit output signal, each of the first means and the second means contributing to the driver output signal generated at a driver output node.

31. The driver circuit of claim 30, wherein the first means further comprises:

a first p-type transistor, one of a source and a drain of the first p-type transistor connected to a HIGH voltage source, the other of the source and the drain of the first p-type transistor connected to the driver output node, the gate of the first p-type transistor connected to the first inverter output lead; and a first n-type transistor, one of a source and a drain of the first n-type transistor connected to the driver output node, the other of the source and the drain of the first n-type transistor connected to a LOW voltage source, the gate of the first n-type transistor connected to the second inverter output lead.

32. The driver circuit of claim 30, further comprising, means for controlling a fall time of the output of the second inverter so that the fall time of the output of the second inverter is faster than a fall time of the output of the first inverter.

33. The driver circuit of claim 31, wherein the second means includes a third inverter with a third inverter input lead and a third inverter output lead, a second p-type transistor, one of a source and a drain of the second p-type transistor connected to a HIGH voltage source, the other of the source and the drain of the second p-type transistor connected to the driver output node, the gate of the second p-type transistor connected to the third inverter output lead, a fourth inverter with a fourth inverter input lead and a fourth inverter output lead, and a second n-type transistor, one of a source and a drain of the second n-type transistor connected to the driver output node, the other of the source and the drain of second n-type transistor connected to the LOW voltage source, the gate of the second n-type transistor connected to the fourth inverter output lead, further comprising:

means for controlling a rise time of an output of the third inverter so that the rise time of an output of the third inverter is faster than a rise time of an output of the fourth inverter.

34. The driver circuit of claim 33, further comprising:

means for controlling a fall time of the output of the fourth inverter so that a fall time of the output of the fourth inverter is faster than a fall time of the output of the third inverter.

35. The driver circuit of claim 33, further comprising:

means for controlling a rise time of an output of the third inverter so that a rise time of an output of the third inverter is slower than a rise time of an output of the first inverter.

36. The driver circuit of claim 33, further comprising:

means for controlling a fall time of the output of the third inverter so that the fall time of the output of the fourth inverter is slower than a fall time of the output of the second inverter.

* * * * *